United States Patent
Bhattacharyya et al.

(12)

(10) Patent No.: US 6,765,819 B1
(45) Date of Patent: Jul. 20, 2004

(54) MAGNETIC MEMORY DEVICE HAVING IMPROVED SWITCHING CHARACTERISTICS

(75) Inventors: Manoj Bhattacharyya, Cupertino, CA (US); Thomas C. Anthony, Sunnyvale, CA (US); Frederick A. Perner, Palo Alto, CA (US); Steven C. Johnson, Eagle, ID (US)

(73) Assignee: Hewlett-Packard Development Company, LP., Houston, TX (US)

( * ) Notice: Subject to any disclaimer, the term of this patent is extended or adjusted under 35 U.S.C. 154(b) by 25 days.

(21) Appl. No.: 10/205,531

(22) Filed: Jul. 25, 2002

(51) Int. Cl.$^7$ .............................................. G11C 11/00
(52) U.S. Cl. ........................ 365/158; 365/171; 365/173
(58) Field of Search ................................. 365/158, 145, 365/171, 173; 257/295

(56) References Cited

U.S. PATENT DOCUMENTS

| | | | | |
|---|---|---|---|---|
| 5,650,958 A | * | 7/1997 | Gallagher et al. | 365/173 |
| 6,114,719 A | * | 9/2000 | Dill et al. | 257/295 |
| 6,134,139 A | | 10/2000 | Bhattacharyya et al. | |
| 6,166,948 A | | 12/2000 | Parkin et al. | |

* cited by examiner

Primary Examiner—David Lam

(57) ABSTRACT

Magnetic memory devices are disclosed. In one embodiment, the device comprises a memory cell having an easy axis aligned along a first direction, the memory cell being configured so as to be most easily switched from one logic state to another when only receiving a magnetic field along the first direction, and a magnetic biasing element associated with the memory cell, the magnetic biasing element having a magnetic orientation aligned along a second direction different from the first direction.

31 Claims, 7 Drawing Sheets

US 6,765,819 B1

MAGNETIC MEMORY DEVICE HAVING IMPROVED SWITCHING CHARACTERISTICS

FIELD OF THE INVENTION

The present disclosure relates to memory devices. More particularly, the disclosure relates to magnetic memory devices having improved switching characteristics.

BACKGROUND OF THE INVENTION

Magnetic memory devices, such as magnetic random access memory (MRAM) devices, are non-volatile semiconductor devices that can be used to store data. An example of one such device 100 is illustrated in FIG. 1. As shown in this figure, the magnetic memory device 100 comprises a plurality of memory cells 102 that are arranged in a two-dimensional array (only a portion of the array shown in FIG. 1). The magnetic memory device 100 also comprises a plurality of column conductors 104 and row conductors 106 that are electrically coupled to the memory cells 102. Specifically, each memory cell 102 is connected to a column conductor 104 and a row conductor 106 at a cross-point of the conductors. Additionally, the magnetic memory device 100 includes column and row control circuits 108 and 110 which control switching for the various column and row conductors 104 and 106, respectively.

FIG. 2 provides a detailed view of a single memory cell 102 and its connection to its associated column and row conductor 104 and 106. As is evident from FIG. 2, each memory cell 102 typically comprises two magnetic layers 200 and 202 that are separated by a thin insulating layer 204. One of the magnetic layers (e.g., the bottom magnetic layer 202) has a fixed or "pinned" magnetic orientation, while the other magnetic layer (e.g., the top magnetic layer 200) has a "free" magnetic orientation that can be toggled from an orientation in which it is aligned with the orientation of the fixed magnetic layer to an orientation in which it opposes the orientation of the fixed magnetic layer. The former state is called the "parallel" state and the latter state is called the "anti-parallel" state. Typically, the orientation of magnetization in the free layer (also referred to as the data layer or the storage layer) is aligned along its "easy" axis.

The two different memory cell states can be used to record data due to their disparate effect on resistance of the memory cell 102. Specifically, the memory cell 102 has a relatively small resistance when in the parallel state, but has a relatively high resistance when in the anti-parallel state. The parallel state can be designated as representing a logic value "1" while the anti-parallel state can be designated as representing a logic value "0" or vice versa. In such a scheme, the magnetic memory device 100 can be written to by changing the magnetic orientation of the free layer of selected memory cells 102.

The control circuits 108 and 110 (FIG. 1) are used to facilitate selection of any given memory cell 102 during reading and writing. Normally, these circuits 108, 110 include a plurality of switches, for instance transistors, that are used to apply voltage and current to the selected conductors.

A memory cell 102 is usually written to a desired logic state by applying external magnetic fields that rotate the orientation of magnetization of its free layer. Typically, the external magnetic fields are applied by delivering current through both conductors 104, 106 associated with the selected memory cell 102 through use of the control circuits 108, 110. In particular, with reference to FIG. 2, the write current flowing through the column conductor 104, $I_{YW}$, generates a write magnetic field along the X direction, $H_{XW}$, and the write current flowing through the row conductor 106, $I_{XW}$, generates a write magnetic field along the Y direction, $H_{YW}$. These external magnetic fields, $H_{XW}$ and $H_{YW}$, in combination flip the orientation of magnetization of the free layer along its easy axis to either the parallel or anti-parallel orientation.

With this writing scheme, only the selected memory cell 102 receives both $H_{XW}$ and $H_{YW}$. The other memory cells 102 coupled to the particular conductors 104, 106 used to flip the selected memory cell only receive a single magnetic field (either $H_{XW}$ or $H_{YW}$). In that they only receive one of the two magnetic fields, these other memory cells 102 are said to be "half-selected." The magnitudes of the applied magnetic fields are preferably chosen to be high enough so that the selected memory cell 102 switches its logic state, but low enough so that the half-selected memory cells do not switch their states.

The above-described switching characteristics are illustrated in FIG. 3, which provides an example switching curve 300 for a memory cell. In the graph, the X axis represents magnetic field in the X direction, $H_X$, and the Y axis represents the magnetic field in the Y direction, $H_Y$. Switching occurs when the memory cell receives a field that extends to or beyond the switching curve 300. Therefore, the switching curve represents the threshold magnetic field that is required to switch a memory cell. When a given X direction write field, $H_{XW}$, and a given Y direction write field $H_{YX}$ are applied to the selected memory cell, a resultant field, $H_R$, is produced that reaches or exceeds the switching curve 300.

As indicated in FIG. 3, the switching curve crosses the X axis at the magnetic coercivity point, $H_c$, and runs asymptotically along the Y axis in both the positive and negative directions. In prior solutions, this configuration was considered ideal in that half-selected memory cells that only receive $H_{YW}$ can never switch and half-selected memory cells that only receive $H_{XW}$ will not switch unless $H_{XW}$ is very large. This latter phenomenon provides a margin, known as the half-select margin, between the applied X direction field ($H_{XW}$) and that required to switch the memory cell when no Y direction field is applied.

Unfortunately, manufacturing variation among memory cells can skew the switching curve and therefore increase the likelihood of half-select switching, i.e. unintended switching of a half-selected memory cell. For example, manufacturing variation in the various dimensions or shapes of the memory cells may increase the likelihood of half-select switching. In addition, variation in the thickness or the crystalline anisotropy of the memory cell free layers may increase the likelihood of half-select switching. Such manufacturing variation decreases the yield in manufacturing processes for magnetic memory devices and reduces their reliability.

FIG. 4 illustrates an example of a switching curve 400 that may result from undesired manufacturing variation. As indicated in this figure, the magnitude of the X direction magnetic field required to switch the selected memory cell is very close to that which would be required to switch a half-selected memory cell that only receives the X direction magnetic field. Hence, the half-select margin for such a memory cell is small, thereby making half-select switching more likely.

From the above, it can be appreciated that it would be desirable to have magnetic memory devices that having improved switching characteristics such that half-select switching can be reduced.

SUMMARY OF THE INVENTION

The present disclosure relates to a magnetic memory device. In one embodiment, the device comprises a memory cell having an easy axis aligned along a first direction, the memory cell being configured so as to be most easily switched from one logic state to another when only receiving a magnetic field along the first direction, and a magnetic biasing element associated with the memory cell, the magnetic biasing element having a magnetic orientation aligned along a second direction different from the first direction.

With such a magnetic memory device, writing can be accomplished by applying a magnetic bias field to the memory cell, applying a first write magnetic field substantially equal in magnitude and opposite in direction to the magnetic bias field to negate the magnetic bias field, and applying a second write magnetic field in a direction different from the magnetic bias field and the first write field, the second write magnetic field having a magnitude sufficient to independently switch a logic state of the memory cell when the magnetic bias field is negated.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

As identified above, manufacturing variation among memory cells can skew the switching curve of memory cells of a magnetic memory device and therefore can increase the likelihood of half-select switching. Disclosed herein are magnetic memory devices having improved switching characteristics so that the likelihood of half-switching is reduced. As is described in greater detail below, the magnetic memory devices include memory cells that are most easily switched (ie. that have switching curves that are most easily reached) when the Y direction magnetic field, $H_y$, that acts upon the memory cell is substantially zero. A magnetic bias field is applied to each of the memory cells in the Y direction such that, when a substantially equal and opposite Y direction magnetic field is applied to the selected memory cell during a write procedure, only the selected cell will receive substantially no Y direction magnetic field. With this writing scheme, the possibility of half-switching is reduced.

Figure 5:
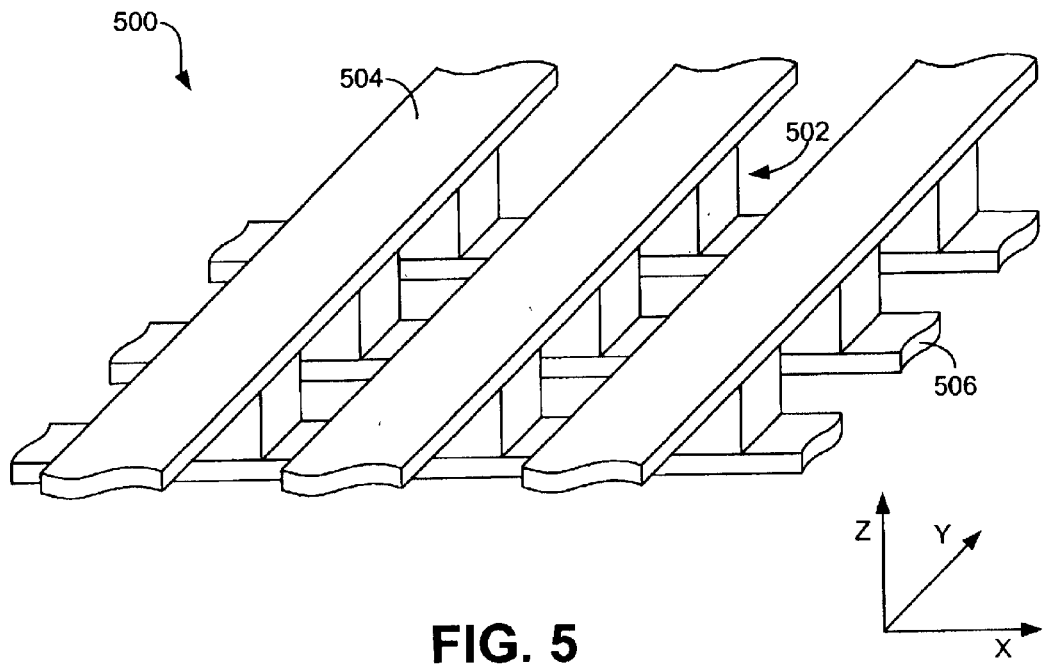
FIG. 5 is a schematic perspective view of a magnetic memory device having improved switching characteristics.

Referring now to the drawings, in which like numerals indicate corresponding parts throughout the several views, FIG. 5 illustrates a portion of a magnetic memory device 500, that, for instance, comprises a magnetic random access memory (MRAM) device. As indicated in FIG. 5, the memory device 500 includes an array of memory cells 502. Although a limited number of memory cells 502 is depicted in FIG. 5, it is to be understood that only a few cells are shown as a representation of the many memory cells of the device 500 to facilitate description of the device. In addition to the memory cells 502, the magnetic memory device 500 includes a plurality of column or bit conductors 504, and a plurality of row or word conductors 506 that, for instance, are substantially orthogonal to the column conductors. Each memory cell 502 of the array is electrically coupled to an associated column conductor 504 and row conductor 506 at a cross-point of the conductors.

Figure 6:
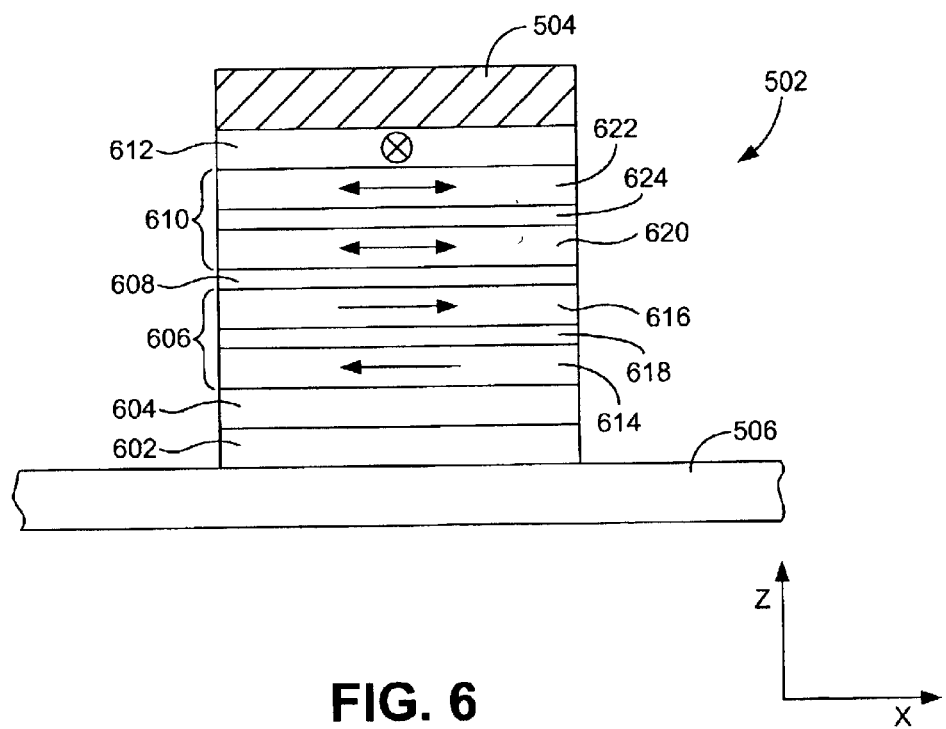
FIG. 6 is a side view of an example configuration for the memory cells of the magnetic memory device of FIG. 5.

As shown in FIG. 6, each memory cell 502 comprises a stack of material layers. Although particular layers and a particular arrangement of layers are shown and will be described herein, it is to be understood that the identified layers and arrangement are provided as an example only.

Beginning with the bottom (in FIG. 6) of the stack, the cell 502 can include a seed layer 602, a pinning layer 604, a pinned layer 606, a dielectric layer 608, a storage layer 610, and a magnetic biasing layer 612. These various layers will now be discussed in detail. Although specific materials are identified for the composition of these layers, it is to be appreciated that these materials are provided as examples only. The seed layer 602 facilitates growth of the other layers having the desired crystal structures and can be composed of tantalum (Ta), tantalum nitride (TaN), ruthenium (Ru), or nickel iron (NiFe). The pinning layer 604 is used to fix or "pin" the magnetic orientation of the pinned layer 606 and can be composed of an antiferromagnetic material such as iridium manganese (IrMn), platinum manganese (PtMn), or iron manganese (FeMn).

The layer 606 is called the pinned (or fixed) layer in that its magnetization direction is fixed and therefore cannot be flipped in the presence of applied magnetic fields. As indicated in FIG. 6, the pinned layer 606 can comprise multiple layers or films of material. For example, the pinned layer 606 can include first and second ferromagnetic films 614 and 616 that are separated by a coupling film 618. In this type of "sandwich" structure, the material of the coupling film 618 is selected and the film dimensioned to give rise to antiferromagnetic exchange coupling between the two ferromagnetic films 614, 616 in the sandwich. Preferred materials for the coupling film 618 are ruthenium (Ru), copper (Cu), Osmium (Os), Rhenium (Re), or chromium (Cr). The magnetic moments of the two ferromagnetic films 614, 616 in the pinned layer 606 are aligned antiparallel to one another (as indicated by arrows) so that the net magnetic moment of the pinned layer is reduced as compared to a pinned layer comprising a single ferromagnetic layer. As is known in the art, this magnetic moment of the pinned layer can alter the switching characteristics of the storage layer. However, since the strength of the magnetostatic field from the ferromagnetic layer 606 is less than that of a pinned layer comprising a single ferromagnetic layer, interference with the storage layer switching characteristics is reduced. By way of example, the ferromagnetic films 614, 616 are composed of cobalt (Co), iron (Fe), nickel (Ni), or alloys containing these materials. For example, the films may be composed of NiFe, NiFeCo, CoFe, or Co alone.

The dielectric layer 608 separates the pinned layer 606 and the storage layer 610 and acts as a magnetic tunnel junction (MTJ) barrier. The dielectric layer 608 can be composed of aluminum oxide ($Al_2O_3$) or aluminum nitride (AlN).

Unlike the pinned layer 606, the magnetic orientation of the storage layer 610 can be flipped by the application of appropriate magnetic fields (indicated by double-headed arrows). However, like the pinned layer 606, the storage layer 610 can comprise multiple layers or films of material. For instance, as shown in FIG. 6, the storage layer 610 can comprise a data film 620 and a control film 622 that are magnetostatically coupled due to their proximate location, but separated by a decoupling film 624. By way of example, the data film 620 and the control layer 622 are composed of NiFe or NiFeCo, and the decoupling layer 624 is composed of Ta, TaN, Ru, or Cu.

The data film 620 functions as a data storage medium that switches its orientation of magnetization around its easy axis in response to applied write fields. Typically, the data film 620 is a "hard" layer, i.e. has a relatively high crystalline anisotropy, $H_K$, for instance approximately 20–50 Oersted (Oe). The control film 622, on the other hand, typically is a "soft" layer, i.e. has a relatively low crystalline anisotropy, for instance approximately 3–5 Oe. The decoupling film 624 prevents magnetic exchange coupling between the data film 620 and the control film 622. The absence of exchange coupling enables the magnetic moments in the data film 620 and the control film 622 to rotate relatively freely with respect to one another.

In steady state, after switching has occurred in the data film 620, the orientation of magnetization of the data film is opposite (i.e; antiparallel) to the orientation of magnetization of the control film 622. This phenomenon is due to magnetostatic coupling between the data film 620 and the control film 622

The magnetic biasing layer 612 is used to apply a magnetic bias field to the memory cell 502 and can be composed of a permanently magnetized or magnetizable material such as a ferromagnetic material. When forming the layer 612 with a deposition process such as sputtering, vapor deposition, etc., a ferromagnetic material such as Co, Fe, and Ni may be used to construct the layer 612 along with elements such as Cr, platinum (Pt), phosphorus (P), or samarium (Sm), which are added to increase crystalline anisotropy. By way of example, the magnetic biasing layer 612 is composed of CoCrPt, CoPt, or CoP. For extremely high crystalline anisotropy alloys, materials including rare-earth metals can be used. For example, samarium-cobalt (SmCo) can be used to form the magnetic biasing layer 612.

Alternatively, the magnetic biasing layer 612 can be made by exchange coupling a ferromagnetic layer to an antiferromagnetic layer. In this case, the uniaxial anisotropy of the exchange coupled ferromagnet is large enough to ensure that the magnetization remains oriented along a prescribed direction. Such an exchange coupled ferromagnetic film can function as a permanent magnet.

Although shown as being provided at the top of the stack of memory cell layers, it is to be appreciated that the magnetic biasing layer 612 could be placed in other locations. For instance, the magnetic biasing layer 612 could be formed at the bottom of the stack on top of the seed layer 602 or completely outside of, yet adjacent to, the stack. In the latter case, the layer could comprise a separate, relatively large magnet that affects all or a group of memory cells. In an alternative, a constant bias field can be provided on selected bit or word lines. As can be appreciated from this discussion, it is the application of the magnetic bias field, not the specific provision of a magnetic biasing layer, that is important.

The field from magnetic biasing layer 612 induces magnetization rotation in the data film 620 and the control film 622, resulting in a scissoring of the originally antiparallel magnetizations. The degrees of rotation in films 620 and 622 in the presence of the perpendicular field provided by the biasing layer 612 and an applied longitudinal field are pronouncedly unequal due to their unequal anisotropies. This inequality becomes more pronounced with larger applied perpendicular magnetic fields.

The remanant states, i.e. the states reached after removal of the applied fields, are complex functions of the applied magnetic fields, film thicknesses, and crystalline anisotropies. It is the remanant states that the magnetizations will remain in the remanant states until a new write process is initiated with new longitudinal field. To summarize, the field needed to induce a remanant state switching of the data layer in the presence of net non-zero perpendicular field is larger than that required in the presence of a net zero perpendicular field.

As indicated in FIG. 6, the magnetic biasing layer 612 can have a magnetic orientation along the positive Y direction. Stated otherwise, the north direction of the magnetic biasing layer 612 extends "into the page" as shown in FIG. 6. Although this orientation is depicted in the figure and described herein, it should be appreciated that the magnetic biasing layer 612 can have the opposite magnetic orientation (i.e. in the negative Y direction) if desired. For purposes of discussion, however, it is assumed that the magnetic biasing layer has a magnetic orientation in the positive Y direction.

Figure 1:
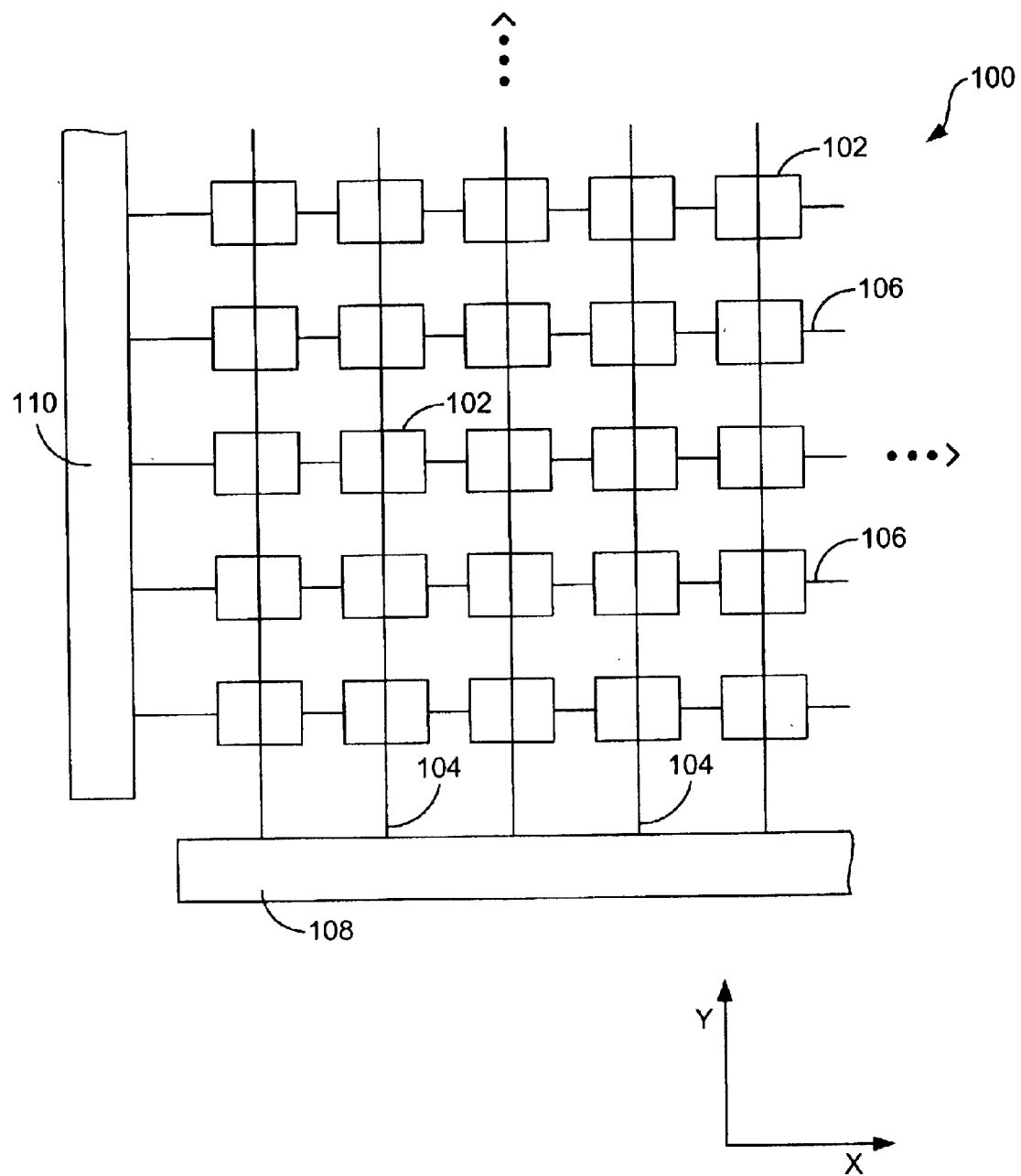
FIG. 1 is schematic plan view of a known magnetic memory device.
Figure 2:
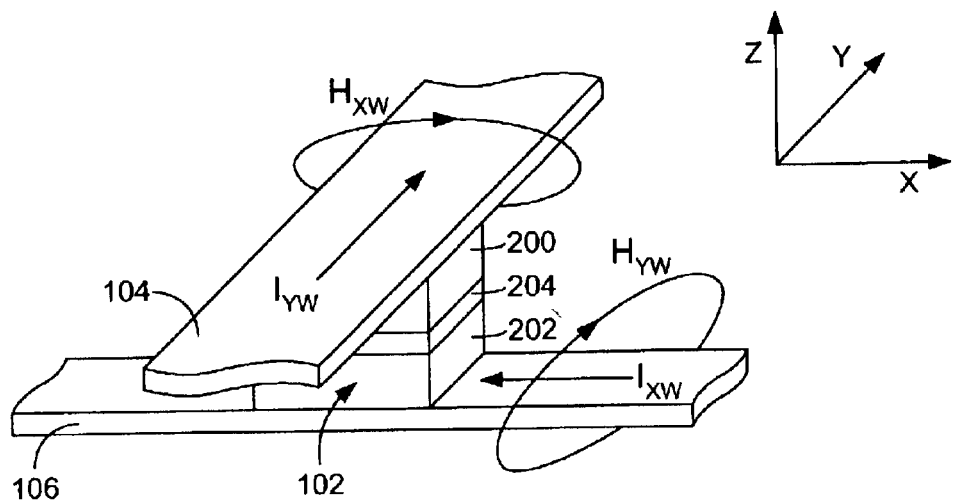
FIG. 2 is a perspective view of a memory cell of the magnetic memory device of FIG. 1.
Figure 3:
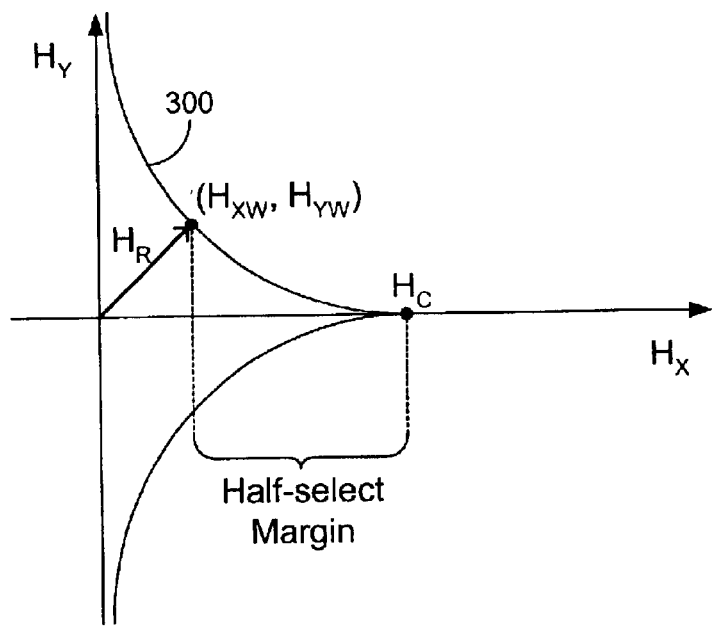
FIG. 3 is a plot of a first example memory cell switching curve.
Figure 7:
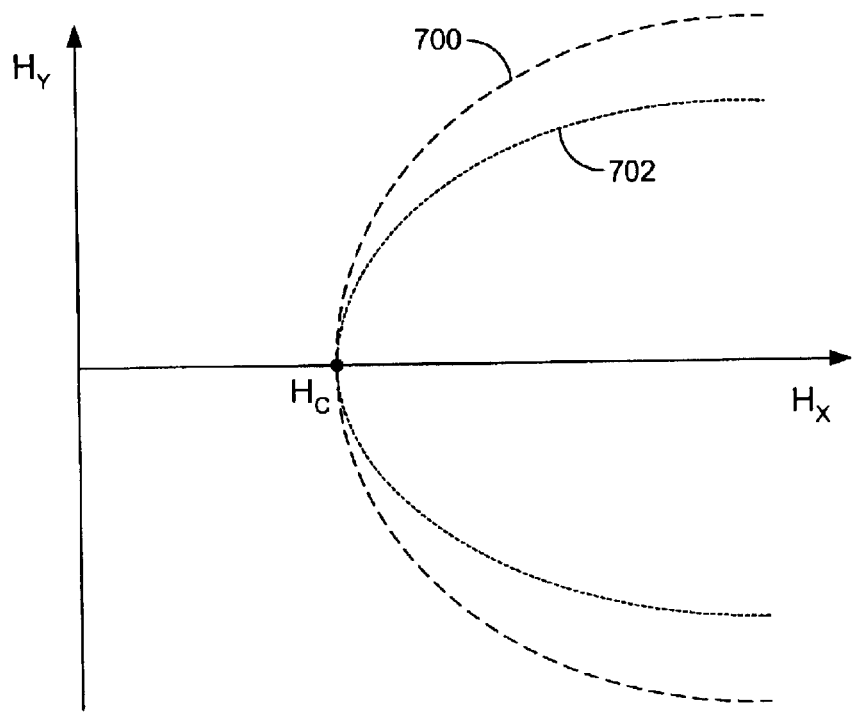
FIG. 7 is a plot of an example switching curve for the memory cell of FIG. 6.

In view of the difficulty in eliminating manufacturing variation among memory cells, it is difficult to achieve a switching curve such as that illustrated above in FIG. 3. Accordingly, a solution is needed that does not require achievement of an ideal switching curve. By modifying the cell structure, the magnetic configuration of the memory cells can be manipulated so as to reshape the switching curve so that only memory cells that receive substantially zero Y direction magnetic field, $H_Y$, are likely to be switched. FIG. 7 illustrates three examples of such curves 700 and 702. It is noted that these curves are provided merely as examples of the types of curves that may be used in the present writing scheme. As indicated in the figure, the switching curve can be arranged as a generally arcuate (e.g., parabolic) line.

With the switching curves such as 700 or 702, switching can be most easily achieved by providing substantially no $H_Y$ to the memory cell. Negation of the $H_Y$ field from magnetic biasing layer 612 for the selected memory cell is accomplished by the application of current in the associated row conductor, producing an opposing Y field. Specifically, when a Y direction (e.g., negative Y direction) magnetic field is generated by the magnetic biasing layer 612 (or some other magnetization source), an opposite Y direction (e.g., positive Y direction) magnetic field can be applied to the selected memory cell via current flow through the row conductor coupled to the cell to generate a net Y direction magnetic field of substantially zero magnitude. In that the selected memory cell also receives the applied X direction magnetic field, the selected memory cell will be switched. As for the half-selected memory cells, those cells either receive no field at all (negation of the Y direction field and no X direction field) or a resultant field that comprises the Y direction magnetic bias field and the applied X direction field to produce a resultant field that does not reach the switching curve 700, 702.

Figure 8:
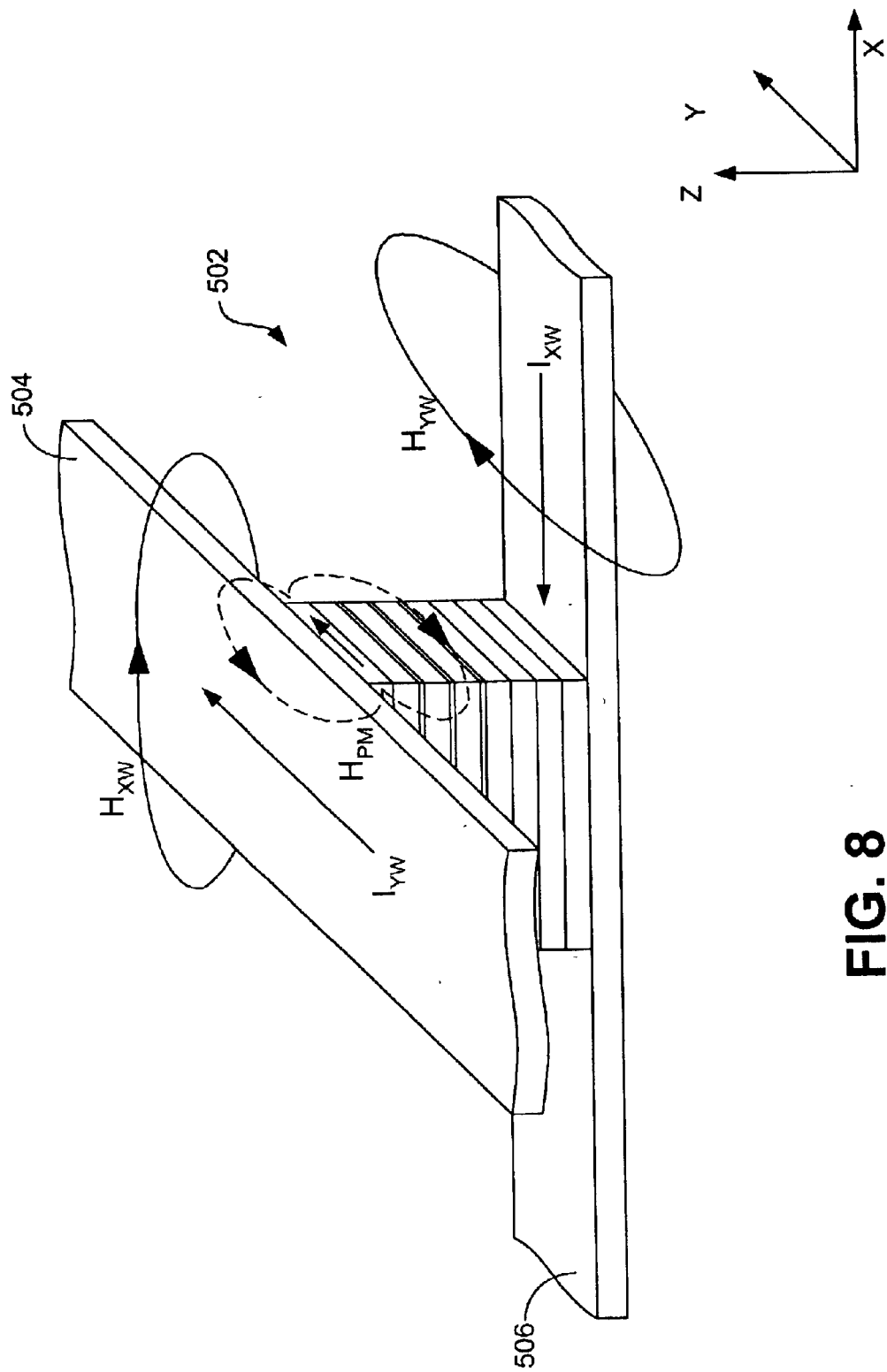
FIG. 8 is a perspective view of the memory cell of FIG. 6 and illustrates magnetic fields that act upon the cell during writing.

Negation of the Y direction magnetic field is illustrated in FIG. 8. As shown in this figure, a selected memory cell 502 receives a positive X direction magnetic field, $H_{XW}$, that results from a positive Y direction write current, $I_{YW}$, and further receives a positive Y direction magnetic field, $H_{YW}$, from a negative X direction write current, $I_{XW}$. Typically, these magnetic fields are orthogonal to each other. Due to the provision of the magnetic biasing layer 612 (FIG. 6), the $H_{YW}$ is negated by the magnetic bias field, $H_{PM}$, "PM" designating "permanent magnetization." As indicated in FIG. 8, this field extends from the north pole of the magnetic biasing layer (direction indicated with an arrow in the layer) to the south pole of the layer so as to oppose $H_{YW}$ generated by $I_{XW}$. If the magnitudes of $H_{PM}$ and $H_{YW}$ are substantially equal, the net Y direction magnetic field received by the memory cell 502, and the storage layer 610 in particular, will be substantially zero. This negation can be achieved through careful selection of the current, $I_{XW}$, and the properties and/or dimensions of the magnetic biasing layer 612.

Figure 4:
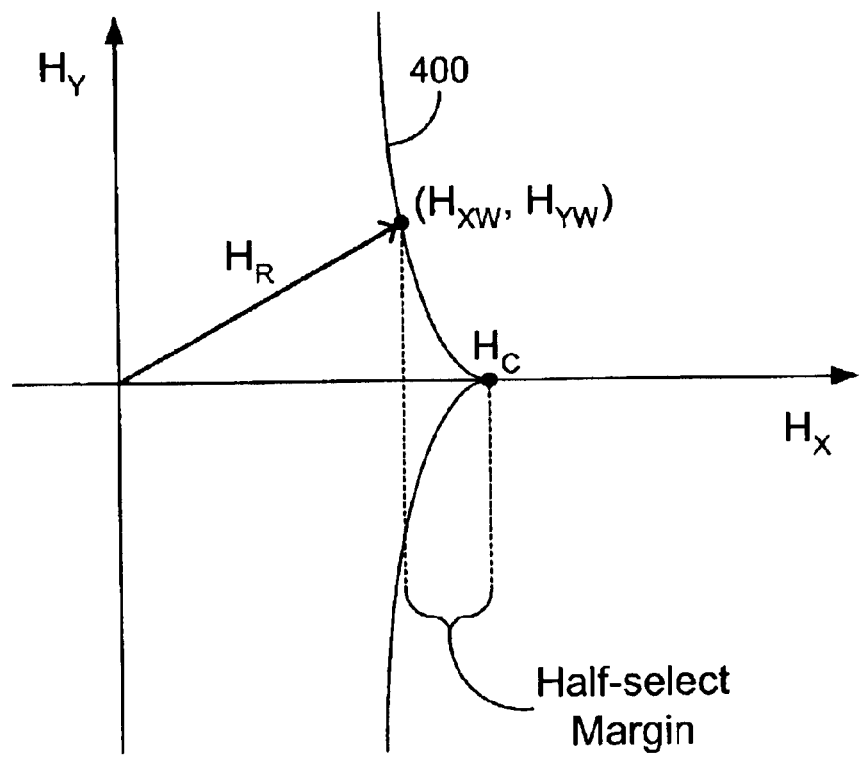
FIG. 4 is a plot of a second example memory cell switching curve.

To facilitate switching in the manner described above, the thicknesses, anisotropies, and other magnetic properties of the data film 620 and the control film 622, as well as the thickness of the decoupling film 624, are tailored to produce a desirable switching curve, i.e. one that results in a minimum switching field when $H_Y$ is substantially zero. For instance, the thickness of the data film 622 can made slightly different than that of the control film 620 to reverse the curvature of the switching curves in the manner shown in FIG. 7 (compare to FIG. 4). The following provides one example configuration: The storage layer 610 can be constructed such that each of its films is approximately 0.2 to 0.5 microns ($\mu$m) long (X direction) and has an aspect ratio of approximately 1.5 to 2 so that the X dimension is greater than the Y dimension. The data film 620 can be composed of NiFeCo and can be approximately 4 nanometers (nm) thick with a crystalline anisotropy of approximately 30 to 40 Oe. The control film 622 can be composed of NiFe and can be approximately 4 nm thick with a crystalline anisotropy of approximately 5 Oe. The decoupling film 624 can be composed of Ta and is preferably very thin, for instance no thicker than approximately 100 nm.

Figure 9A:
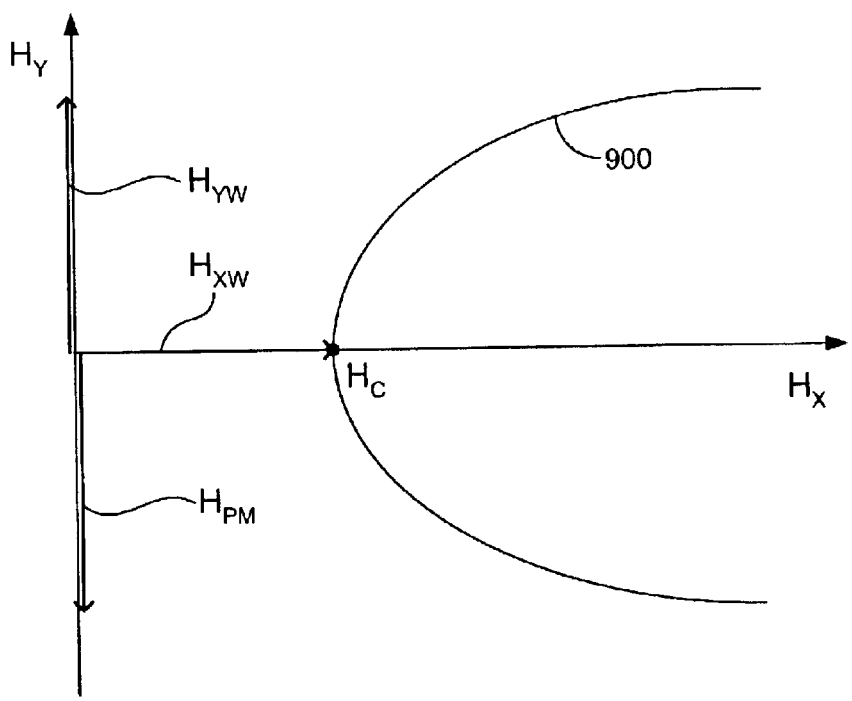
FIG. 9A is a graph that illustrates the magnetic fields acting upon a selected memory cell during a write procedure and their effect on switching.
Figure 9B:
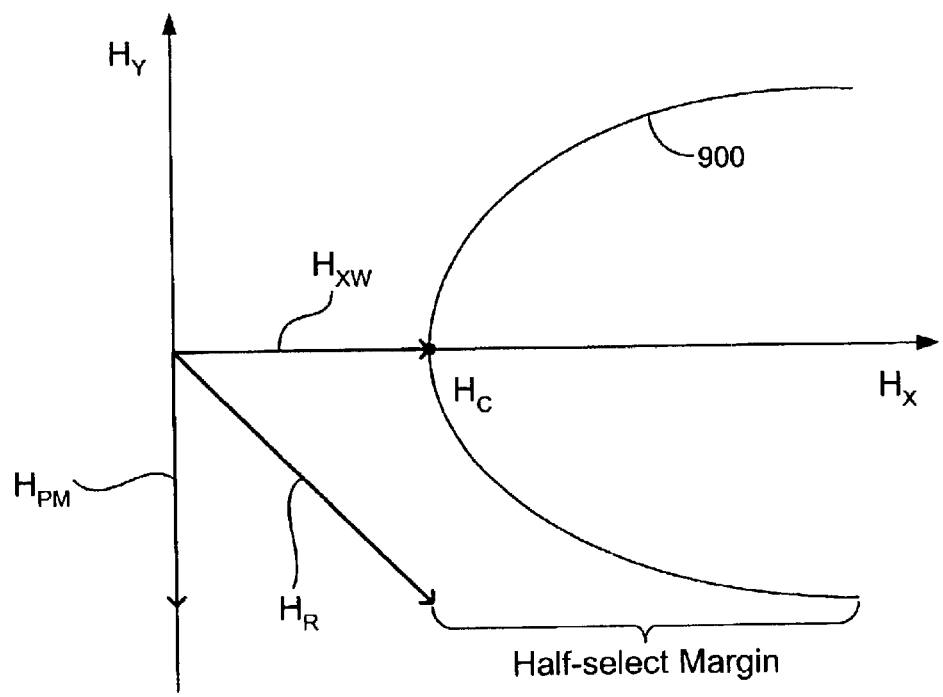
FIG. 9B is a graph that illustrates the magnetic fields acting upon a first half-selected memory cell during a writing procedure and their effect on switching.
Figure 9C:
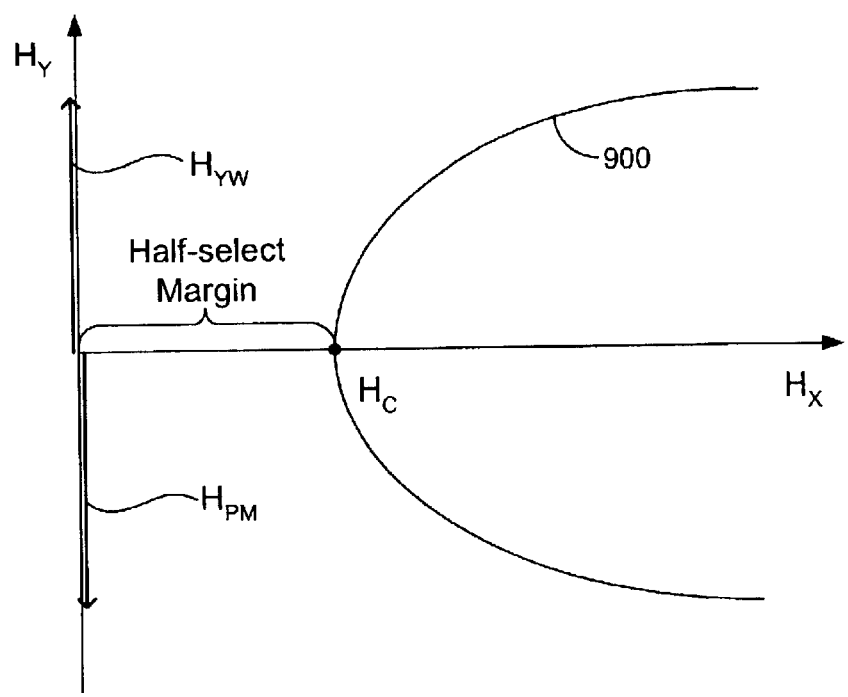
FIG. 9C is a graph that illustrates the magnetic fields acting upon a second half-selected memory cell during a write procedure and their effect on switching.

FIGS. 9A–9C illustrate the magnetic fields acting upon a given memory cell having a switching curve 900 of the type shown in FIG. 7 during a write procedure. More particularly, FIG. 9A illustrates the fields acting upon a selected memory cell, FIG. 9B illustrates the fields acting upon a half-selected memory cell that receives only the X direction applied magnetic field, $H_{XW}$, and FIG. 9C illustrates the fields acting upon a half-selected memory cell that receives only the Y direction applied magnetic field, $H_{YW}$. Beginning with FIG. 9A, the selected memory cell receives the applied fields $H_{XW}$ and $H_{YW}$ that are generated by currents $I_{YW}$ and $I_{XW}$, respectively, as well as $H_{PM}$ generated by the magnetic biasing layer 612. The two Y fields cancel each other out leaving only $H_{XW}$ remaining. In that $H_{XW}$ is sufficient in magnitude to reach the magnetic coercivity point, $H_C$, alone, the switching curve 900 is reached, thereby indicating successful switching of the memory cell.

With reference now to FIG. 9B, the half-selected memory cells coupled to the column conductor 504 to which the selected memory cell is coupled (FIG. 5) receives $H_{XW}$ that is generated by $I_{YW}$. In that no Y direction magnetic field is applied to the cell, except for $H_{PM}$, a resultant magnetic field, $H_R$, i.e. the vector sum of $H_{XW}$ and $H_{PM}$, is generated which fails to reach the switching curve 900, thereby indicating that, as intended, the half-selected memory cell will not switch. As is apparent from FIG. 9B, the half-select margin can be very large. Indeed, if switching curve 900 is operative and a large $H_{PM}$ is present, it is possible to have a nearly infinite half-select margin.

Finally, with reference to FIG. 9C, the half-selected memory cells coupled to the row conductor 506 to which the selected memory cell is coupled (FIG. 5) receives $H_{YW}$ that is generated by $I_{XW}$, as well as $H_{PM}$. As described above, the two fields cancel each other out. Accordingly, the memory cell receives substantially no magnetic field and the half-selected memory cell will not switch. Again, this results in a very large half-select margin as indicated in FIG. 9C.

While particular embodiments of the invention have been disclosed in detail in the foregoing description and drawings for purposes of example, it will be understood by those skilled in the art that variations and modifications thereof can he made without departing from the scope of the invention as set forth in the following claims. For instance, although a Y direction bias field has been described above, it will be appreciated that an X direction bias field could be applied instead if the storage layers of the memory cells are oriented such that their easy axes are aligned along the Y direction (i.e. their switching curves oriented so as to cross the Y axis).

What is claimed is:

1. A method for writing to a magnetic memory device, comprising:

applying a magnetic bias field to a selected memory cell of the magnetic memory device;

applying a first write magnetic field substantially equal in magnitude and opposite in direction to the magnetic bias field to the selected memory cell to negate the magnetic bias field for the selected memory cell; and applying a second write magnetic field in a direction different from the magnetic bias field and the first write field, the second write magnetic field having a magnitude sufficient to independently switch a logic state of the selected memory cell when the magnetic bias field is negated.

2. The method of claim 1, wherein the step of applying a magnetic bias field comprises applying a magnetic bias field with a magnetic biasing layers of the memory cells.

3. The method of claim 1, wherein the step of applying a magnetic bias field comprises applying a magnetic bias field along a Y direction of the magnetic memory device.

4. The method of claim 1, wherein the step of applying a first write magnetic field comprises applying a first write magnetic field generated by current that flows through a conductor associated with the selected memory cell.

5. The method of claim 1, wherein the step of applying a second write magnetic field comprises applying a second write magnetic field generated by current that flows through a conductor associated with the selected memory cell.

6. The method of claim 1, wherein the first direction and the second direction are substantially orthogonal to each other.

7. A method for writing to a magnetic memory device, comprising:

applying a magnetic bias field to substantially every memory cell of the magnetic memory device, the magnetic bias field aligned along a Y direction of the magnetic memory device;

applying a Y direction write magnetic field substantially equal in magnitude and opposite in direction to a selected memory cell to negate the magnetic bias field acting on the selected memory cell; and applying an X direction write magnetic field having a magnitude sufficient to independently switch a logic state of the memory cell when the magnetic bias field is negated.

8. The method of claim 7, wherein the step of applying a magnetic bias field comprises applying a permanent magnetic bias field with magnetic biasing layers of the memory cells.

9. The method of claim 7, wherein the step of applying a Y direction write magnetic field comprises applying a Y direction write magnetic field generated by current that flows through an X direction row conductor associated with the selected memory cell.

10. The method of claim 7, wherein the step of applying an X direction write magnetic field comprises applying an X direction write magnetic field generated by current that flows through a Y direction column conductor associated with the selected memory cell.

11. A magnetic memory device, comprising:
a memory cell having an easy axis aligned along a first direction, the memory cell being configured so as to be most easily switched from one logic state to another when only receiving a magnetic field along the first direction; and
a magnetic biasing element associated with the memory cell, the magnetic biasing element having a magnetic orientation aligned along a second direction different from the first direction.

12. The device of claim 11, wherein the second direction is substantially orthogonal to the first direction.

13. The device of claim 11, wherein the easy axis of the memory cell is aligned along an X direction of the memory device.

14. The device of claim 13, wherein the magnetic biasing element has a magnetic orientation aligned along a Y direction.

15. The device of claim 11, wherein the magnetic biasing element comprises a magnetic biasing layer of the memory cell.

16. The device of claim 15, wherein the magnetic biasing layer is composed of a ferromagnetic material.

17. The device of claim 11, further comprising a storage layer comprising a data film and a control film, the data film and the control film being magnetically antiparallel to each other.

18. A magnetic memory device, comprising:
a plurality of memory cells having an easy axis aligned along an X direction of the magnetic memory device, each memory cell including a pinned layer, a free layer, and a magnetic biasing layer, the magnetic biasing layer having a magnetic orientation along a Y direction of the magnetic memory device;
wherein the memory cell is configured so as to be most easily switched from one logic state to another when substantially no Y direction magnetic field is received.

19. The device of claim 18, wherein the magnetic biasing layer has a magnetic orientation aligned in the positive Y direction so as to generate a magnetic field in the negative Y direction.

20. The device of claim 18, wherein the pinned layer comprises first and second ferromagnetic films that are separated by an antiferromagnetic coupling film, the ferromagnetic films being magnetically antiparallel to each other.

21. The device of claim 18, wherein the storage layer comprises a data film and a control film, the data film and the control film being magnetically antiparallel to each other.

22. A magnetic memory device, comprising:
a plurality of memory cells having an easy axis aligned along a first direction of the magnetic memory device, each memory cell including a pinned layer, a free layer, and a magnetic biasing layer, the magnetic biasing layer having a magnetic orientation along a second direction of the magnetic memory device;
a plurality of row conductors arranged along the first direction such that each memory cell has an associated row conductor;
a plurality of column conductors arranged along the second direction such that each memory cell has an associated column conductor; and
wherein the memory cell is configured so as have a switching curve that is most easily reached when a magnetic field is only received along the second direction.

23. The device of claim 22, wherein the pinned layer comprises first and second ferromagnetic films that are separated by an antiferromagnetic coupling film, the ferromagnetic films being magnetically antiparallel to each other.

24. The device of claim 23, wherein the storage layer comprises a data film and a control film, the data film and the control film being magnetically antiparallel to each other.

25. The device of claim 23, wherein the magnetic biasing layer is composed of a ferromagnetic material.

26. The device of claim 22, wherein the first direction and the second direction are substantially orthogonal to each other.

27. A memory cell having an easy axis aligned along a first direction, comprising:
a pinned layer having a fixed magnetic orientation;
a free layer having a magnetic orientation that can be flipped so as to be parallel to or antiparallel to that of the pinned layer with a suitable applied magnetic field; and
a magnetic biasing layer having a magnetic orientation aligned along a second direction;
wherein the memory cell is configured so as to be most easily switched from one logic state to another when substantially no magnetic field is received in the second direction.

28. The memory cell of claim 27, wherein the magnetic biasing layer has a magnetic orientation aligned in a positive Y direction so as to generate a magnetic field in a negative Y direction.

29. The memory cell of claim 27, wherein the pinned layer comprises fist and second ferromagnetic films that are separated by an antiferromagnetic coupling film, the ferromagnetic films being magnetically antiparallel to each other.

30. The memory cell of claim 27, wherein the storage layer comprises a data film and a control film, the data film and the control film being magnetically antiparallel to each other.

31. The memory cell claim 27, wherein the first direction and the second direction are substantially orthogonal to each other.

* * * * *